United States Patent [19]
Smith et al.

[11] Patent Number: 5,726,858
[45] Date of Patent: Mar. 10, 1998

[54] SHIELDED ELECTRICAL COMPONENT HEAT SINK APPARATUS

[75] Inventors: Darryl K. Smith, Spring; Alfred Faust, Missouri City, both of Tex.

[73] Assignee: Compaq Computer Corporation, Houston, Tex.

[21] Appl. No.: 652,294

[22] Filed: May 23, 1996

[51] Int. Cl.$^6$ ........................................ H05K 7/20
[52] U.S. Cl. ...................... 361/705; 336/61; 361/719
[58] Field of Search ............................ 165/80.3, 185; 174/16.3, 252; 336/61; 361/688, 704, 705, 706, 736, 752, 717–719

[56] References Cited

U.S. PATENT DOCUMENTS

| | | | |
|---|---|---|---|
| 4,558,406 | 12/1985 | Geissler | 363/126 |
| 4,794,318 | 12/1988 | Maschek | 323/358 |
| 5,185,691 | 2/1993 | Korinsky | 361/386 |
| 5,258,888 | 11/1993 | Korinsky | 361/704 |
| 5,281,154 | 1/1994 | Comerci | 439/107 |
| 5,467,251 | 11/1995 | Katchmar | 361/719 |
| 5,561,323 | 10/1996 | Andros | 257/707 |

*Primary Examiner*—Gerald P. Tolin
*Attorney, Agent, or Firm*—Konneker & Smith, P.C.

[57] ABSTRACT

An AC adapter for use with a portable computer has a primary transformer disposed within a plastic housing. A shielded heat sink assembly is positioned in the housing between the transformer and a facing interior side surface portion of the housing. The shielded heat sink assembly includes a resilient block of thermally conductive, high dielectric strength silicon material pressed into contact with a thermally conductive copper heat transfer band wrapped around the housing of the transformer. From its contact area with the copper band the silicon block extends through an opening in a black-colored plastic radiant shield sheet and is adhered to the inner side of a copper heat sink sheet with a thermally conductive adhesive material that also adheres the outer side of the plastic shield sheet to the inner side of the copper heat sink sheet. The outer side of the copper heat sink sheet is adhered to the facing interior side surface portion of the housing with thermally conductive adhesive material. During operation of the transformer, heat that it generates is efficiently conducted to ambient via the silicon block, the copper heat sink sheet, and the facing housing wall. The shield sheet serves to absorb radiant heat generated by the transfer and materially reduce the amount of such radiant heat undesirably transferred to other components within the AC adapter housing.

20 Claims, 2 Drawing Sheets

SHIELDED ELECTRICAL COMPONENT HEAT SINK APPARATUS

BACKGROUND OF THE INVENTION

1. Field of the Invention

The present invention generally relates to electronic apparatus, and in a preferred embodiment thereof more particularly relates to the dissipation of heat from internal components of electronic devices such as computer devices.

2. Description of Related Art

The heat generating components of electronic devices, for example computer devices and accessories, are typically disposed within a protective housing of having a suitable configuration. Because these components are normally not exposed directly to ambient air, it becomes necessary to dissipate their operating heat to the exterior of the housing in order to prevent thermally caused component failure or degradation.

For example, the primary transformer in an AC adapter used to receive 110 volt AC power and convert it to, for example, 12 volt DC for supply to a computer can generate a considerable amount of heat within its usually rather small protective outer housing. To prevent this heat from being unacceptably high, it has been customary to modify the transformer circuitry to reduce the heat output of its circuitry, or to use relatively complex heat sink apparatus which required that specially designed and correspondingly expensive transformer core materials be used for compatibility with the heat sink apparatus.

From both complexity and cost standpoints, neither of these previously utilized methods of reducing or dissipating transformer operating heat has proven to be entirely satisfactory. It is accordingly an object of the present invention to provide improved apparatus for more economically dissipating operating heat from a housing-contained electrical component such as a primary transformer in an AC adapter assembly useable in conjunction with a computer or other electronic apparatus.

SUMMARY OF THE INVENTION

In carrying out principles of the present invention, in accordance with a preferred embodiment thereof, an electronic device is provided with a specially designed heat sink assembly that facilitates heat dissipation to ambient from a heat generating electrical component within a housing portion of the device.

The electronic device is representatively an AC adapter useable in conjunction with a portable computer, and the heat generating component is representatively a primary transformer portion of the AC adapter. In a preferred embodiment thereof, the electronic device includes a housing having first and second separable portions, the first housing portion having an exterior wall with an interior side surface. The heat generating electrical component is disposed in the second housing portion and has a side portion spaced inwardly apart from the interior side surface of the first housing portion in a facing relationship therewith.

The heat sink assembly includes a sheet of metallic material having a first side secured to the interior side surface of the housing, and a second side; a sheet of radiant heat absorptive material secured to the second side of the sheet of metallic material and having an opening therein; and a resilient heat conductive member extending through the opening and being at least slightly compressed between the side portion of the electrical component and the second side of the sheet of metallic material.

In the AC adapter embodiment of the invention, the primary transformer has a core portion circumscribed by a metallic heat transfer band member, and the resilient heat conductive member is at least slightly compressed between a portion of the heat transfer band member and the second side of the sheet of metallic member.

The sheet of metallic material is representatively a copper sheet, the sheet of radiant heat absorptive material is preferably a black sheet of plastic film material, and the resilient heat conductive member is preferably formed from a resilient block of thermally conductive, high dielectric strength silicon material.

During operation of the electronic device, heat generated by the electrical component is efficiently conducted to the exterior housing wall, sequentially via the resilient heat conductive member and the sheet of metallic material, and dissipated to ambient from the exterior housing wall. A substantial portion of the radiant heat generated by the electrical component is absorbed by the radiant heat absorptive "shield" material and thus prevented from being re-radiated from the heat sink assembly to other electrical components within the housing.

DETAILED DESCRIPTION

Figure 1:
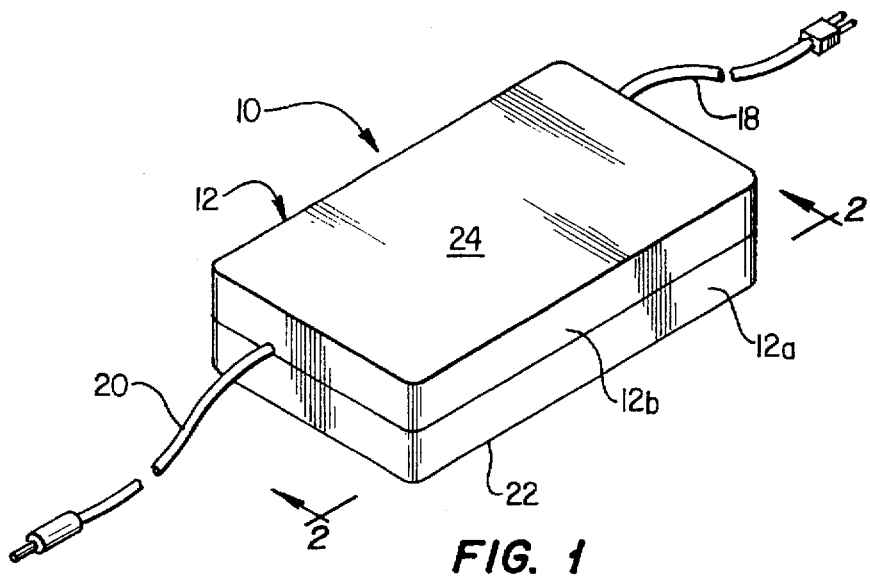
FIG. 1 is a perspective view of an AC adapter incorporating therein a specially designed shielded heat sink apparatus embodying principles of the present invention.
Figure 2:
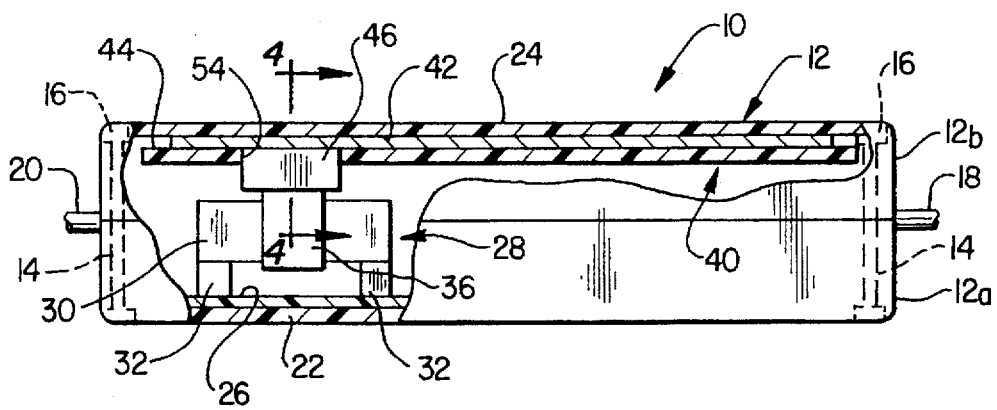
FIG. 2 is a partially cut away side elevational view of the AC adapter taken along line 2—2 of FIG. 1.

Illustrated in FIGS. 1 and 2 is an electronic device, representatively an AC adapter 10 for use in conjunction with a portable computer (not shown), that embodies principles of the present invention. The AC adapter 10 includes an elongated rectangular plastic housing 12 having a bottom portion 12a to which an upper lid portion 12b is removably joined by four screws 14 (see FIG. 2) extending upwardly through corner portions of the bottom housing portion 12a and threaded into interior corner boss portions 16 in the housing lid portion 12b. Extending outwardly from opposite ends of the housing 12 are an AC power input cord 18 connectable to a suitable AC power source, and a DC power output cord 20 connectable to the computer to supply, for example, converted 12 volt DC power thereto. The bottom housing portion 12a has a bottom side wall 22, and the lid portion 12b has a top side wall 24.

Figure 4:
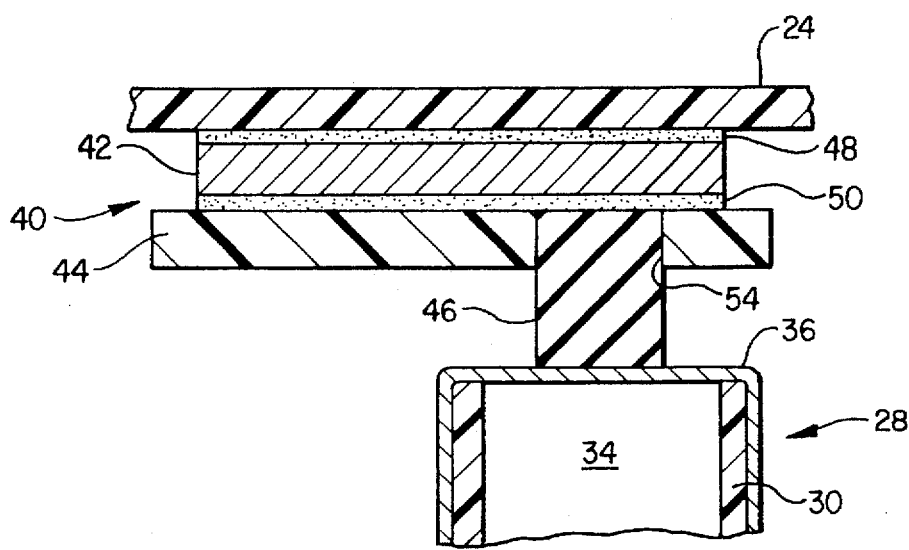
FIG. 4 is an enlarged scale partial cross-sectional view through the AC adapter taken generally along line 4—4 of FIG. 2.
Figure 3:
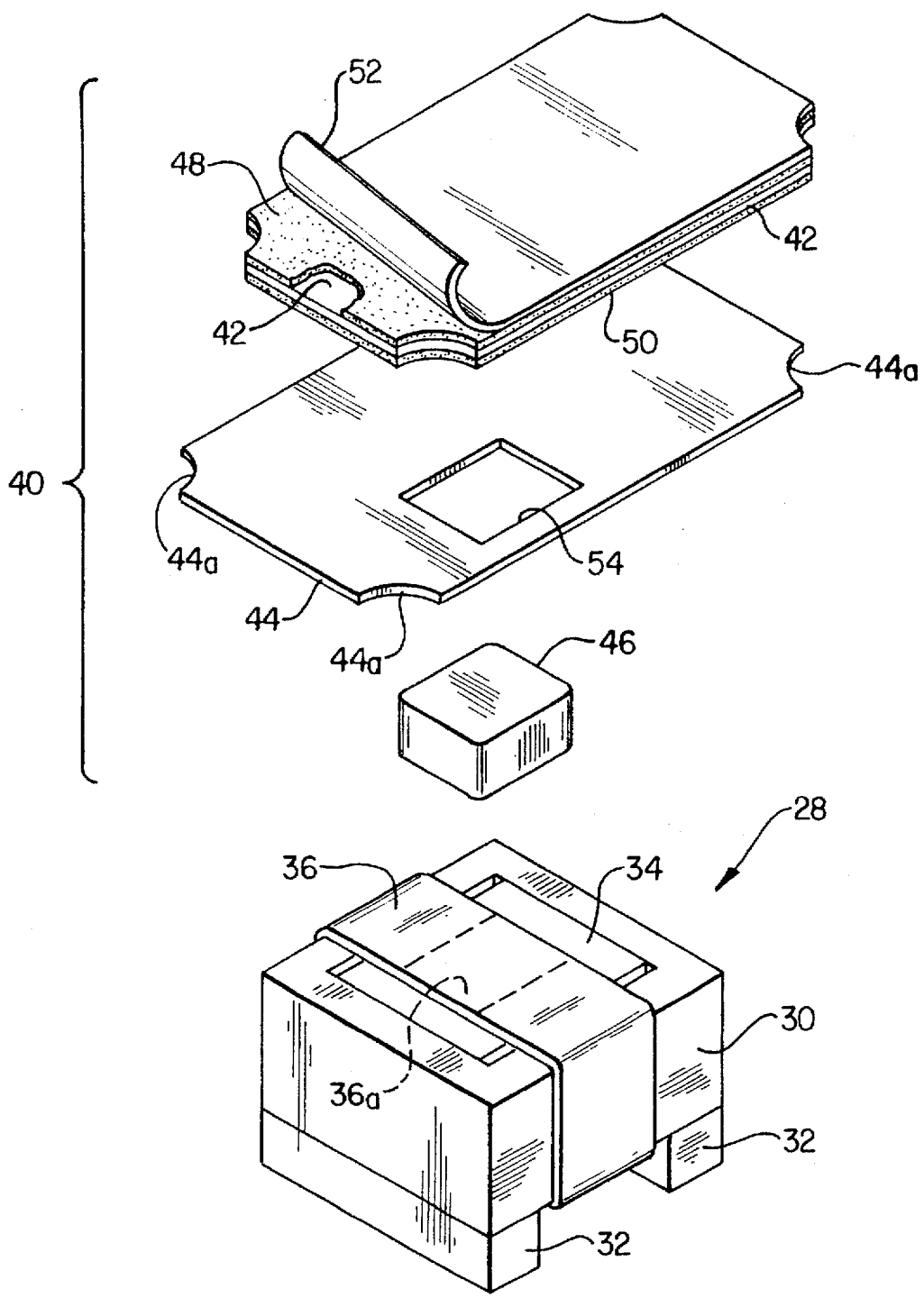
FIG. 3 is an enlarged scale exploded perspective view of a portion of the AC adapter including the shielded heat sink apparatus.

Disposed within the interior of the housing 12 (see FIG. 2) are a variety of electrical components including a main printed circuit board 26 positioned atop the bottom housing side wall 22, and a primary transformer 28 secured to the top side of the printed circuit board 26. As illustrated in FIGS. 2–4, the transformer 28 has a hollow rectangular core portion 30 from which a spaced pair of parallel support bases 32 depend, an electrical winding section 34 disposed within the interior of the core portion 30, and a metallic heat transfer strip 36 (preferably a copper strip) longitudinally wrapped around the core portion 30, between the support bases 32, as best illustrated in FIG. 3.

In a manner subsequently described herein, the copper strip 36 cooperates with a specially designed shielded heat sink assembly 40 to very efficiently dissipate operating heat from the transformer 28. The shielded heat sink assembly 40 includes, from top to bottom as illustrated in FIGS. 2–4, a metallic heat sink sheet 42 (preferably aluminum or copper), a radiant shield sheet 44, and a generally rectangular resilient silicon heat sink block 46.

The heat sink sheet 42 has layers 48,50 of thermally conductive adhesive material respectively disposed on its top and bottom sides, the upper adhesive layer 48 being initially covered with a peel-off protective paper sheet 52 (see FIG. 3). Representatively, the thermally conductive adhesive material is #9458 adhesive material as manufactured by the 3M Company.

The shield sheet 44 is preferably formed from a radiation absorptive, black-colored plastic film material such as Lexan FR 700–701 manufactured by the General Electric Company. Shield sheet 44 is secured to the underside of the heat sink sheet 42, by the bottom layer 50 of thermally conductive adhesive material, and has a rectangular opening 54 formed therein.

Heat sink block 46 is preferably formed from a high dielectric strength, thermally conductive resilient silicon-based material, such as the T274 CHO-THERM material manufactured by Chomerics, Inc. of Woburn, Mass. As illustrated, an upper end portion of the block 46 projects upwardly through the radiant shield sheet opening 54 and is bonded to the bottom side of the heat sink sheet 42 by a portion of the bottom thermally conductive adhesive layer 50.

With the housing lid 12b removed, the shielded heat sink assembly 40 is very easily and quickly installed in the lid 12b by simply peeling off the protective paper sheet 52 (see FIG. 3) and adhering the now exposed adhesive covered top side of the metal heat sink sheet 42 to the inner side of the housing lid top side wall 24 as best illustrated in FIG. 4. As illustrated in FIG. 3, the corners of the radiant shield sheet 44 are provided with arcuate cutout portions 44a to provide clearance from the lid connection bosses 16 (see FIG. 2).

After the shielded heat sink assembly 40 is installed in the housing lid 12b as just described, the lid 12b is reattached to the bottom housing portion 12a. This reattachment of the lid 12b to the bottom housing portion 12a causes the resilient heat sink block 46 to downwardly engage and be slightly compressed by a central portion 36a of the heat transfer strip 36 (see FIG. 3), thereby establishing conductive thermal communication between the transformer core 30 and the top side wall 24 of the housing lid 12b sequentially via the heat transfer strip 36, the silicon heat sink block 46, the bottom adhesive layer 50, the heat sink sheet 42 and the top adhesive layer 48. Accordingly, during operation of the AC adapter 10, operating heat from the transformer 28 is very efficiently transferred to the top side wall 24 of the housing lid 12b and dissipated therefrom to ambient. The metallic heat transfer strip 36 not only serves as a thermally conductive interface between the transformer 28 and the shielded heat sink assembly 40, but also serves as at least a partial EMI shield for the transformer.

According to a key aspect of the present invention, the sheet 44 not only serves to absorb radiant operating heat from the transformer, but also serves to prevent radiant heat from the transformer from being reflected back onto the various other electrical components within the housing 12. The assembly 40 is relatively inexpensive to manufacture, is quite easy to install, is highly effective from an operating heat dissipation standpoint, and does not require any space on the printed circuit board 26.

The use of the shielded heat sink assembly 40 of the present invention eliminates the previous need to form the transformer core 30 from special materials and/or to provide the transformer 28 with specially designed low heat generation circuitry. Thus, the transformer 28 may be of a generally conventional, relatively inexpensive construction. As will be readily appreciated by those of skill in this particular art, while the shielded heat sink assembly 40 has been representatively illustrated as being used in conjunction with a housing-disposed transformer, it could also be utilized to advantageously with various other types of housing-disposed heat generating electrical components as well.

The foregoing detailed description is to be clearly understood as being given by way of illustration and example only, the spirit and scope of the present invention being limited solely by the appended claims.

What is claimed is:

1. Electronic apparatus comprising:

a housing having an exterior wall with an interior side surface;

a heat generating electrical component disposed in said housing and having a side portion spaced inwardly apart from said interior side surface in a facing relationship therewith; and heat sink means for facilitating the dissipation of heat generated by said electrical component, said heat sink means including:

a thermally conductive first member having a first side secured to said interior side surface in a heat transfer relationship therewith, and a second side facing and spaced apart from said side portion of said electrical component, a dielectric, thermally conductive second member forming a heat conduction path between said side portion of said electrical component and a facing portion of said second side of said first member, and a radiant heat absorptive third member secured to and covering said second side of said first member, said third member having formed therein an opening through which said second member extends.

2. The electronic apparatus of claim 1 wherein:

said first member is a sheet of metallic material.

3. The electronic apparatus of claim 2 wherein:

said first member is a sheet of copper.

4. The electronic apparatus of claim 2 wherein:

said first side of said first member is secured to said interior side surface of said housing with a layer of thermally conductive adhesive material.

5. The electronic apparatus of claim 1 wherein:

said third member is a sheet of nonmetallic material.

6. The electronic apparatus of claim 5 wherein:

said third member is secured to said second side of said first member with a layer of thermally conductive adhesive material.

7. The electronic apparatus of claim 5 wherein:

said third member is a sheet of plastic film material.

8. The electronic apparatus of claim 5 wherein:

said third member has a generally black coloration.

9. The electronic apparatus of claim 1 wherein:

said second member is secured to said second side of said first member with a layer of thermally conductive adhesive material.

10. The electronic apparatus of claim 1 wherein:

said second member is formed from a resilient material and is at least slightly compressed between said side portion of said electrical component and said second side of said first member.

11. The electronic apparatus of claim 10 wherein:

said second member is formed from a thermally conductive resilient silicon material.

12. The electronic apparatus of claim 1 wherein:

said housing has first and second separable portions, with said first housing portion including said exterior wall and said electrical component being disposed in said second housing portion.

13. The electronic apparatus of claim 12 wherein:

said first housing portion is a removable lid portion of said housing.

14. The electronic apparatus of claim 1 wherein:

said electronic apparatus is an AC adapter assembly useable in conjunction with a computer.

15. The electronic apparatus of claim 14 wherein:

said electrical component is a transformer.

16. The electronic apparatus of claim 15 wherein:

said transformer has a core portion circumscribed by a thermally conductive metallic band member, and said second member is formed from a resilient material and is at least slightly compressed between said metallic band member and said second side of said first member.

17. An electronic device comprising:

a housing having first and second separable portions, said first housing portion having an exterior wall with an interior side surface;

a heat generating electrical component disposed in said second housing portion and having a side portion spaced inwardly apart from said interior side surface of said first housing portion in a facing relationship therewith; and a heat sink assembly operative to dissipate heat from said electrical component and including:
 a sheet of metallic material having a first side secured to said interior side surface, and a second side,
 a sheet of radiant heat absorptive material secured to said second side of said sheet of metallic material and having an opening therein, and
 a resilient heat conductive dielectric member extending through said opening and being at least slightly compressed between said side portion of said electrical component and said second side of said sheet of metallic material.

18. The electronic device of claim 17 wherein:

said resilient heat conductive member is formed from a silicon material.

19. The electronic device of claim 17 wherein:

said sheet of radiant heat absorptive material is formed from a plastic film material.

20. The electronic device of claim 19 wherein:

said plastic film material has a generally black coloration.

\* \* \* \* \*